(12) United States Patent
Djahanshahi et al.

(10) Patent No.: US 10,749,470 B2
(45) Date of Patent: Aug. 18, 2020

(54) METHOD AND APPARATUS FOR MULTIMODE WIDEBAND OSCILLATOR

(71) Applicant: Microsemi Storage Solutions, Inc., Aliso Viejo, CA (US)

(72) Inventors: Hormoz Djahanshahi, Port Moody (CA); Amir Hossein Masnadi Shirazi Nejad, North Vancouver (CA); Mohammad Shahidzadeh Mahani, Coquitlam (CA)

(73) Assignee: MICROSEMI STORAGE SOLUTIONS, INC., Aliso Viejo, CA (US)

( * ) Notice: Subject to any disclaimer, the term of this patent is extended or adjusted under 35 U.S.C. 154(b) by 1 day.

(21) Appl. No.: 16/185,644

(22) Filed: Nov. 9, 2018

(65) Prior Publication Data

US 2020/0153386 A1    May 14, 2020

(51) Int. Cl.
*H03B 5/12* (2006.01)
*H03B 5/00* (2006.01)
*H03B 27/00* (2006.01)
*H01L 29/94* (2006.01)

(52) U.S. Cl.
CPC ........... *H03B 5/1243* (2013.01); *H01L 29/94* (2013.01); *H03B 5/00* (2013.01); *H03B 5/1206* (2013.01); *H03B 27/00* (2013.01); *H03B 2201/0208* (2013.01)

(58) Field of Classification Search
CPC ........... H01L 29/94; H03B 5/00; H03B 27/00; H03B 5/1243; H03B 5/1206; H03B 2201/0208
USPC ................................ 331/167, 117 FE, 177 V
See application file for complete search history.

(56) References Cited

U.S. PATENT DOCUMENTS

| 8,723,609 | B2 * | 5/2014 | Chang | H03B 5/1228 327/118 |
| 2011/0148535 | A1 * | 6/2011 | Lee | H03B 27/00 331/117 FE |

OTHER PUBLICATIONS

Murphy et al., "Implicit Common-Mode Resonance in LC Oscillators," IEEE Journal of Solid-State Circuits, Mar. 2017, vol. 52 (3), pp. 812-821.

* cited by examiner

*Primary Examiner* — Arnold M Kinkead
(74) *Attorney, Agent, or Firm* — Leber IP Law; David C. Robertson

(57) ABSTRACT

A multimode, multicore inductor-capacitor (LC) oscillator having an increased oscillation frequency tuning range, and related method, are provided. The oscillation frequency tuning range of existing oscillators is limited. LC oscillators are known to have very low phase noise but a narrow frequency tuning range. The present oscillator has at least two LC oscillator cores and is capable of operating in multiple different modes of oscillation thereby increasing its overall oscillation frequency tuning range. A set of programmable amplifier pairs is used to force particular relative oscillation phases at the nodes of the multiple cores of the oscillator to realize one or more additional modes of oscillation for the oscillator. The additional oscillation mode increases the frequency tuning range of the oscillator.

19 Claims, 11 Drawing Sheets

*H0, L0, f0*
*L0 = (1+k) L0'*

(Pairs 1, 2, 3, 4 correspond to amplifier pairs 310, 350, 360, 370)

METHOD AND APPARATUS FOR MULTIMODE WIDEBAND OSCILLATOR

CROSS REFERENCE TO RELATED APPLICATIONS

Not applicable.

FIELD

The present disclosure relates to oscillators, and more particularly to LC oscillators having multiple LC oscillator cores.

BACKGROUND

Electronic oscillators are used in a variety of electronic circuits. Voltage controlled oscillators (VCOs) are type of electronic oscillator. A VCO has a voltage input that controls the oscillation frequency. An inductor-capacitor (LC) VCO is a VCO that includes a frequency-selective resonance tank including an inductor and a capacitor.

It is often desirable to tune the oscillator to a particular oscillation frequency. The oscillation frequency of an LC VCO is known to be tunable through means such as control voltage adjusting variable capacitors (varactors), or via switchable capacitors. However, the overall oscillation frequency tuning range (FTR) of existing oscillators is limited. LC VCOs are known to have very low phase noise but a narrow FTR.

Improvements in tunable oscillators are desired, including in their overall oscillation frequency tuning ranges.

The above information is presented as background information only to assist with an understanding of the present disclosure. No assertion or admission is made as to whether any of the above might be applicable as prior art with regard to the present disclosure.

SUMMARY

According to an aspect, the present disclosure is directed to a multicore inductor-capacitor (LC) oscillator comprising: a first and a second oscillator each comprising an LC resonance tank, where an inductor of the LC resonance tank of the first oscillator is magnetically coupled and electrically connected with an inductor of the LC resonance tank of the second oscillator; a first differential amplifier pair cross-coupled across a first and a second node of the LC tank of the first oscillator; a second differential amplifier pair cross-coupled across a first and a second node of the LC tank of the second oscillator; a third differential amplifier pair cross-coupled across the first node of the LC tank of the first oscillator and the first node of the LC tank of the second oscillator; a fourth differential amplifier pair cross-coupled across the second node of the LC tank of the first oscillator and the second node of the LC tank of the second oscillator, wherein the oscillator is configurable to operate in a first mode at a first oscillation frequency wherein: all of the first, second, third, and fourth differential amplifier pairs are enabled and configured to force the same oscillation phase on both the first node of the first oscillator and the second node of the second oscillator, and to force an opposite oscillation phase on both the second node of the first oscillator and the first node of the second oscillator.

In an embodiment, the multicore LC oscillator is configured to operate in a second mode, separate from the first mode, at a second oscillation frequency lower than the first oscillation frequency, wherein: the first and second differential amplifier pairs are enabled to provide opposite oscillation phases on the first and second nodes of the first oscillator, and to provide opposite oscillation phases on the first and second nodes of the second oscillator, wherein the first nodes of the first and second oscillators have the same oscillation phase; and the third and fourth differential amplifier pairs are disabled.

In an embodiment, the multicore LC oscillator is configured to sustain substantially the first oscillation frequency after the third and fourth differential amplifier pairs are disabled while the first and second differential amplifier pairs remain enabled.

In an embodiment, the third and fourth differential amplifier pairs are configured to have insufficient gain to sustain oscillation at an oscillation frequency that is higher than the first oscillation frequency.

In an embodiment, at least a portion of a connecting conductor electrically connecting one of the third and fourth differential amplifier pairs to one of the first and second nodes of the LC tank of one of the first and second oscillators is substantially vertically aligned with at least a portion of a conductor of the inductor of the LC resonance tank of one of the first or second oscillators relative to a substrate on which the multicore LC oscillator is formed, thereby reducing the inductance introduced by the connecting conductor.

In an embodiment, the LC resonance tank of at least one of the first and second oscillators comprises a programmable capacitance C module for selectively configuring the capacitance C of the LC tank to enable selective tuning of the oscillation frequency of the multicore LC oscillator.

In an embodiment, the programmable capacitance C module comprises a variable voltage-dependent capacitor.

In an embodiment, the spacing between the inductor of the LC resonance tank of the first oscillator and the inductor of the LC resonance tank of the second oscillator affects the frequency separation between the first and second oscillation frequencies.

In an embodiment, the multicore LC oscillator is configured to operate in a third mode, separate from the first and second modes, at a third oscillation frequency higher than the second oscillation frequency and lower than the first oscillation frequency, wherein: only one of the first and second differential amplifier pairs is enabled, and the third and fourth amplifier pairs are disabled.

In an embodiment, the multicore LC oscillator is configured to operate in a fourth mode, separate from the first mode, at a fourth oscillation frequency higher than the first oscillation frequency, wherein: the first and second differential amplifier pairs are disabled, the third and fourth differential amplifier pairs are enabled and configured to force the same oscillation phase on both the first and second nodes of the first oscillator, and to force an opposite oscillation phase on both the first and second nodes of the second oscillator, wherein the third and fourth amplifier pairs are configured to have sufficient gain to sustain oscillation at the fourth oscillation frequency corresponding to resonance frequency of any inductance and capacitance between the respective outputs of each of the third and fourth amplifier pairs.

According to an aspect, the present disclosure is directed to a method of operating a multicore inductor-capacitor (LC) oscillator, the method comprising: providing the multicore LC oscillator, which comprises: a first and second oscillator each comprising an LC resonance tank, where an inductor of the LC resonance tank of the first oscillator is magnetically coupled and electrically connected with an inductor of the LC resonance tank of the second oscillator; a first differential amplifier pair cross-coupled across first and second nodes of the LC tank of the first oscillator; a second differential amplifier pair cross-coupled across first and second nodes of the LC tank of the second oscillator; a third differential amplifier pair cross-coupled across the first node of the LC tank of the first oscillator and the first node of the LC tank of the second oscillator; and a fourth differential amplifier pair cross-coupled across the second node of the LC tank of the first oscillator and the second node of the LC tank of the second oscillator; and selectively configuring the oscillator to operate in a first mode at a first oscillation frequency by: enabling and configuring all of the first, second, third, and fourth differential amplifier pairs to force the same oscillation phase on both the first node of the first oscillator and the second node of the second oscillator, and to force an opposite oscillation phase on both the second node of the first oscillator and the first node of the second oscillator.

In an embodiment, the method comprises configuring the oscillator to operate in a second mode, separate from the first mode, at a second oscillation frequency lower than the first oscillation frequency, by: enabling the first and second differential amplifier pairs to provide opposite oscillation phases on the first and second nodes of the first oscillator, and to provide opposite oscillation phases on the first and second nodes of the second oscillator, wherein the first nodes of the first and second oscillators have the same oscillation phase; and disabling the third and fourth differential amplifier pairs.

In an embodiment, the method further comprises configuring the oscillator to sustain substantially the first oscillation frequency after the third and fourth differential amplifier pairs are disabled while the first and second differential amplifier pairs remain enabled.

In an embodiment, the method further comprises configuring the third and fourth differential amplifier pairs to have insufficient gain to sustain oscillation at an oscillation frequency that is higher than the first oscillation frequency.

In an embodiment, the method further comprises configuring the oscillator such that at least a portion of a connecting conductor electrically connecting one of the third and fourth differential amplifier pairs to one of the first and second nodes of the LC tank of one of the first and second oscillators is substantially vertically aligned with at least a portion of a conductor of the inductor of the LC resonance tank of one of the first or second oscillators relative to a substrate on which the multicore LC oscillator is formed thereby reducing the inductance introduced by the connecting conductor.

In an embodiment, the method further comprises selectively tuning the oscillation frequency of the multicore LC oscillator by configuring a programmable capacitance C module of the LC resonance tank of at least one of the first and second oscillators to adjust the capacitance C of the LC tank.

In an embodiment, the configuring a programmable capacitance C module comprises adjusting a variable voltage-dependent capacitor.

In an embodiment, the spacing between the inductor of the LC resonance tank of the first oscillator and the inductor of the LC resonance tank of the second oscillator affects the frequency separation between the first and second oscillation frequencies.

In an embodiment, the method comprises configuring the oscillator to operate in a third mode separate from the first and second modes, and at a third oscillation frequency higher than the second oscillation frequency and lower than the first oscillation frequency by: enabling only one of the first and second differential amplifier pairs, and disabling the third and fourth amplifier pairs.

In an embodiment, the method comprises configuring the oscillator to operate in a fourth mode, separate from the first mode, at a fourth oscillation frequency higher than the first oscillation frequency by: disabling the first and second differential amplifier pairs; enabling and configuring the third and fourth differential amplifier pairs to force the same oscillation phase on both the first and second nodes of the first oscillator, and to force an opposite oscillation phase on both the first and second nodes of the second oscillator, and to have sufficient gain to sustain oscillation at the fourth oscillation frequency corresponding to resonance frequency of any inductance and capacitance between the respective outputs of each of the third and fourth amplifier pairs.

The foregoing summary provides some aspects and features according to the present disclosure but is not intended to be limiting. Other aspects and features of the present disclosure will become apparent to those ordinarily skilled in the art upon review of the following description of specific embodiments in conjunction with the accompanying figures. Accordingly, the drawings and detailed description are to be regarded as illustrative in nature and not restrictive.

BRIEF DESCRIPTION OF THE DRAWINGS

Embodiments of the present disclosure will now be described, by way of example only, with reference to the attached Figures.

DETAILED DESCRIPTION

This disclosure generally relates to oscillators having an increased oscillation frequency tuning range. In an aspect, an oscillator having multiple oscillator cores is capable of operating in multiple different modes of oscillation thereby increasing its overall oscillation frequency tuning range. In this context, the term mode of oscillation refers to a specific frequency and phase relationship between the relative oscillation phases at the nodes of the cores of an oscillator. The introduction of one or more oscillation modes at higher or lower frequencies in addition to the baseline frequency range of the oscillator may significantly extend the overall frequency tuning range of the oscillator. In the context of differential LC oscillators, this may be accomplished by providing a multicore oscillator where the inductors of at least two cores of the oscillator are electrically connected at least at one point as a baseline, and by adding a programmable set of cross-coupled amplifier pairs to the baseline oscillator. The set of programmable amplifier pairs are in addition to the standard amplifiers of an oscillator core used to overcome energy losses in the LC tank to sustain periodic steady-state oscillations. The set of programmable amplifier pairs are configured to force particular oscillation phase relations at the nodes of the cores of the oscillator. By doing so, the oscillator is configured to operate in one or more additional modes of oscillation. In this manner, the frequency tuning range may be increased, sometimes significantly, with a small implementation area overhead. Such an extended frequency range is generally too difficult to achieve practically through capacitance tuning only, for example using voltage-tunable varactors and/or switchable capacitors, in a traditional single core or multicore oscillator, such as an LC VCO. In other words, it can be very difficult, if not impractical, to achieve an extended frequency tuning range using an oscillator having only one mode of oscillation. On the other hand, using multiple independent oscillators to cover an extended tuning range involves significant area overhead, and also does not bring other advantages of a multicore oscillator such as improved phase noise.

The term "multicore" or "multi-core" is used herein to refer to an LC oscillator comprised of multiple underlying LC oscillator elements, each considered a "core" that has its own LC tank and oscillator amplifier. The multiple LC oscillator elements in each core may be similar, and in some instances generally identical. The oscillator cores collectively oscillate at one frequency. A multicore oscillator is often used to improve the phase noise of the oscillation.

Figure 1A:
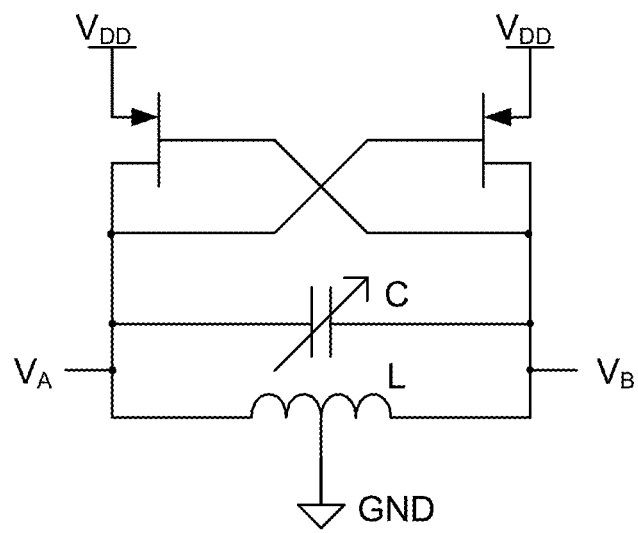
FIGS. 1A, 1B, and 1C, respectively, show known example P-type metal-oxide-semiconductor (PMOS) only, N-type MOS (NMOS) only, and complementary MOS (CMOS) implementations of a differential LC-based voltage-controlled oscillator (LC VCO).
Figure 1B:
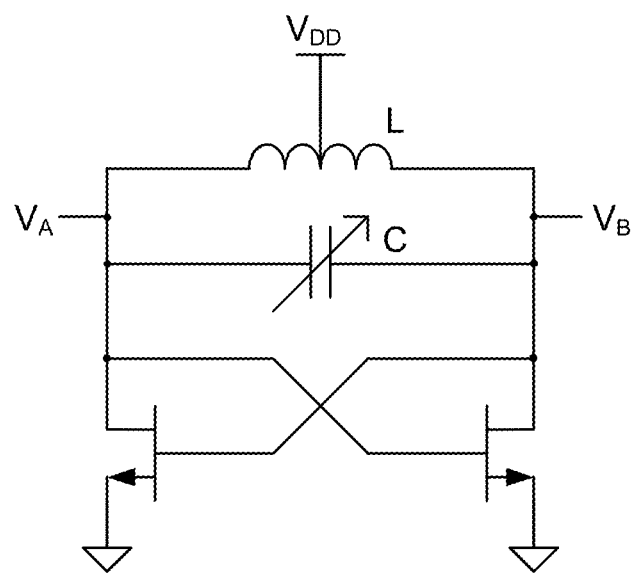
Figure 1C:
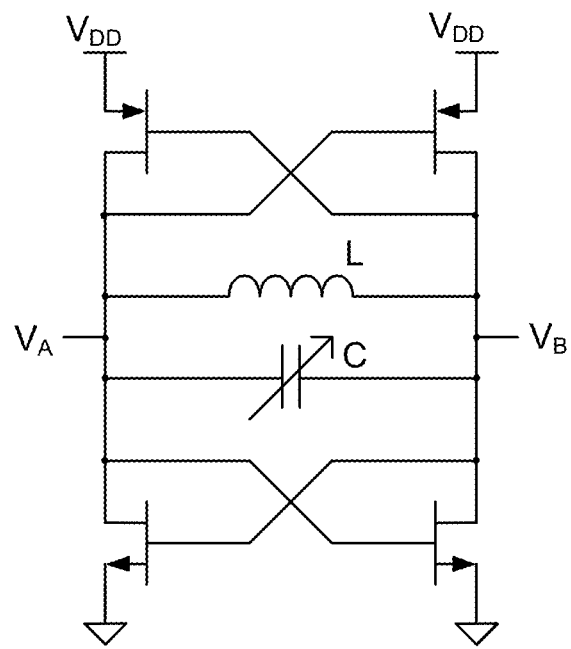
Figure 1D:
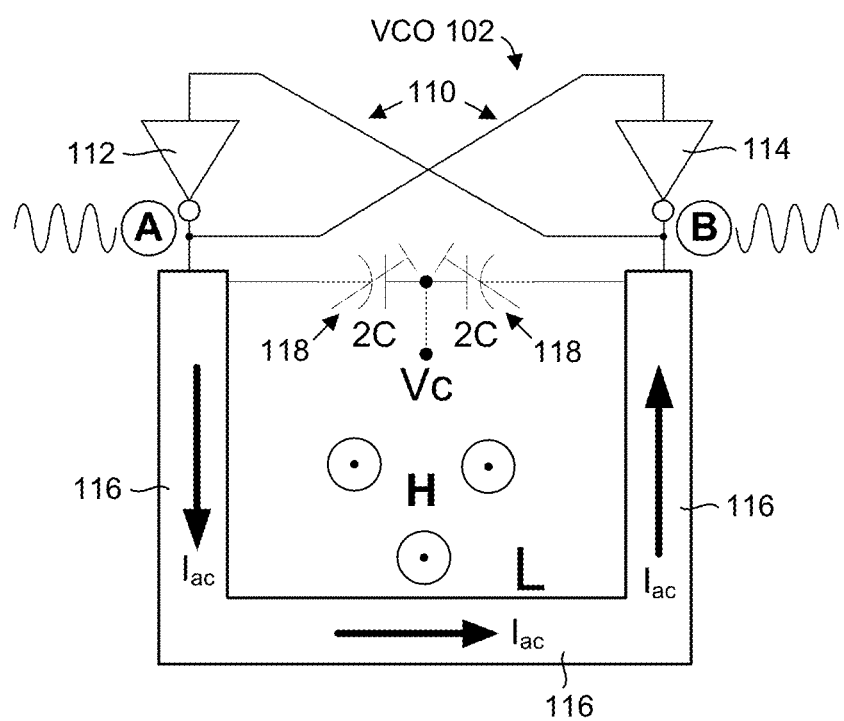
FIG. 1D shows an alternative representation of an LC VCO.

FIGS. 1A, 1B, and 1C, respectively, show known example P-type metal-oxide-semiconductor (PMOS) only, N-type MOS (NMOS) only, and complementary MOS (CMOS) implementations of a differential LC-based voltage-controlled oscillator (LC VCO). FIG. 1D shows an alternative representation of an LC VCO 102 having a pair 110 of inverting amplifiers 112, 114 that may be viewed equivalent to any of the circuits in FIGS. 1A, 1B, 1C. LC VCO 102 comprises an inductor 116, and one or more variable capacitors 118, which together form the LC tank of LC VCO 102. Amplifiers 112, 114 are cross-coupled across a first node A and a second node B of the LC tank of VCO 102. When amplifier pair 110 is enabled, it is configured to force opposite oscillation phases on first node A and second node B, as represented by the example waveforms shown at nodes A and B in FIG. 1D. Vc represents the tuning control voltage for variable capacitors (varactors) 118. The conventional direction of the oscillatory current $I_{ac}$ is indicated by the arrows at inductor 116, and the polarity of the magnetic field H in the central region of inductor loop 116 is indicated by the circle containing a dot (⊙). This represents a magnetic field vector that comes out of the page perpendicularly according to the right-hand rule.

Figure 2:
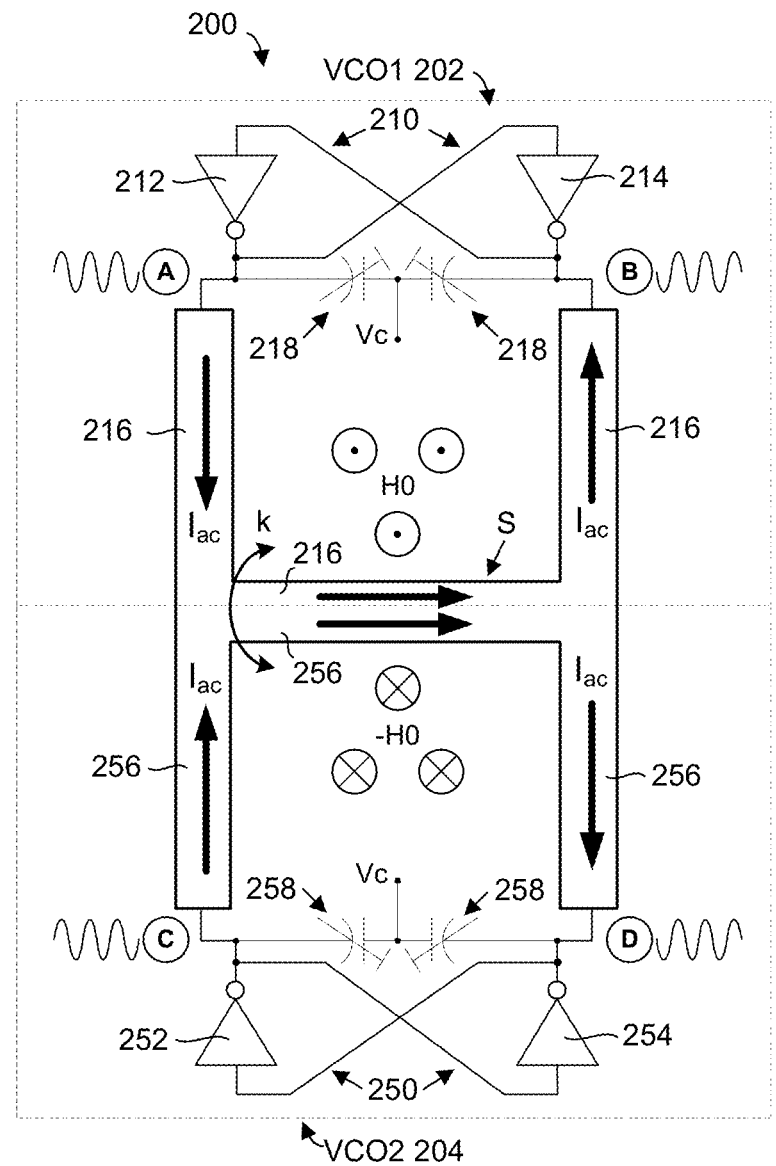
FIG. 2 is a representation of an example oscillator with a configuration of at least two differential LC VCO cores.

FIG. 2 is a representation of an example oscillator 200 with a configuration of at least two differential LC VCO cores 202, 204 having magnetically-coupled inductors and collectively oscillating at a common frequency. The circuit of FIG. 2 is used as a baseline for further discussion below.

LC VCO core 202, denoted hereinafter VCO1 202, comprises a driver in the form of a pair 210 of cross-coupled differential transconductance amplifiers 212, 214, an inductor 216, and one or more variable capacitors 218, which may be in the form of voltage-tunable variable capacitors (varactors), and/or digitally-programmable capacitors. Inductor 216 is illustrated as a single-turn inductor for the sake of simplicity, but in other embodiments the inductor may be a multi-turn inductor. Inductor 216 and capacitors 218 form the LC tank of core VCO1 202. Each amplifier 212, 214 has an inverting transconductance gain of −Gm. Further, amplifiers 212, 214 are cross-coupled across a first node A and a second node B of the LC tank of VCO1 202. When amplifier pair 210 is enabled, it is configured to force opposite oscillation phases on first node A and second node B, as represented by the example waveforms shown at nodes A and B in FIG. 2. The cross-coupled amplifier structure of amplifier pair 210 works to overcome energy losses in the corresponding LC tank, comprising inductor 216 and capacitors 218, thereby sustaining periodic steady-state oscillations. Inductor 216 and capacitors 218 approximately set the natural resonant frequency of VCO1 core 202. By tuning the control voltage of one or both capacitors 218, the frequency of VCO1 core 202 can be fine-tuned. For example, a phase-locked loop (PLL) circuit may be used to lock the output signal frequency and phase of oscillator 200 to the frequency and phase of a system level input reference clock signal.

Second VCO2 core 204 has a similar structure and configuration as VCO1 core 202. VCO2 core 204 comprises a driver in the form of a pair 250 of cross-coupled differential transconductance amplifiers 252, 254, an inductor 256, and one or more variable capacitors 258. Inductor 256 and capacitors 258 form the LC tank of core VCO2 204. Each amplifier 252, 254 has an inverting transconductance gain of −Gm. Further, amplifiers 252, 254 are cross-coupled across a first node C and a second node D of the LC tank of VCO2 204. When amplifier pair 250 is enabled, it is configured to force opposite oscillation phases on nodes C and D.

The two respective inductors 216 and 256 in VCO1 202 and VCO2 204 may be electrically connected at one or more points. In FIG. 2, inductors 216 and 256 share a common side, which is labelled 'S' in the figure. In other words, a part of each of inductor 216 and 256 shares the same physical conductor.

The two respective VCO cores, VCO1 202 and VCO2 204, may be matched by design, and through their mutually-coupled inductors exhibit a natural mode of oscillation that is dominant, self-starting, and self-sustained, provided the amplifier pairs 210 and 250 have sufficient gain to sustain the oscillation when a nominal DC power supply voltage is connected to the system. In FIG. 2, nodes A and C exhibit identical oscillation frequencies and phases, while nodes B and D also exhibit identical oscillation frequencies and phases with respect to each other, but their phases are opposite (180 degrees out-of-phase) with respect to the oscillation phase at nodes A and C. The specific frequency and phase relationships between the oscillation phases at nodes A, B, C, and D define a particular mode of oscillation for oscillator 200. In this case for the natural mode of oscillation, oscillation currents $I_{ac}$ in the two inductor loops of VCO1 202 and VCO2 204 circulate in opposite directions, meaning one clockwise and the other one counter-clockwise, which leads to current summation in the common side 'S' of the two inductor loops 216, 256 indicated by the two arrows pointing in the same direction.

Consequently, the magnetic fields H0 in each of the two inductor loops 216, 256 add constructively, which boosts the total magnetic flux $\Phi$ through each loop and hence the resulting inductance L0 of each inductor 216, 256 (inductance is proportional to magnetic flux divided by the current: $L \propto \Phi/I_{ac}$). The polarity of the magnetic field H0 of core VCO1 202 is directed out of the page according to the right-hand rule and indicated by the three circles each containing a dot ($\odot$) in the central region of each inductor loop 216. The polarity of the magnetic field −H0 of core VCO2 204 is directed into the page according to the right-hand rule and indicated by the three circles each containing a cross ($\otimes$) in the central region of each inductor loop 256. In FIG. 2, the magnetic field of each inductor loop is indicated with three circles here to represent the field generated by current elements in each of the three sides of each inductor loop.

The oscillation frequency of the dual-core oscillator 200, denoted as f0, is inversely proportional to the square root of the inductance L0 and to the square root of the capacitance C in each LC tank. Note that in this case L0=[(1+k)L0']>L0', where 0<k<1 is a magnetic coupling factor (as between inductors 216 and 256), and L0' is the self-inductance of a standalone inductor 216, 256 without any mutual coupling effect.

On the other hand, if only one of the differential amplifier pairs 210 or 250 is enabled, while the other one is disabled, the effective inductance in the active oscillator core will be the standalone self-inductance L0', and hence the standalone oscillation frequency will be $f_0'=1/(2\pi\sqrt{L0' \cdot C})$. Since L0'<L0, the oscillation frequency f0' will be higher than f0.

Figure 3:
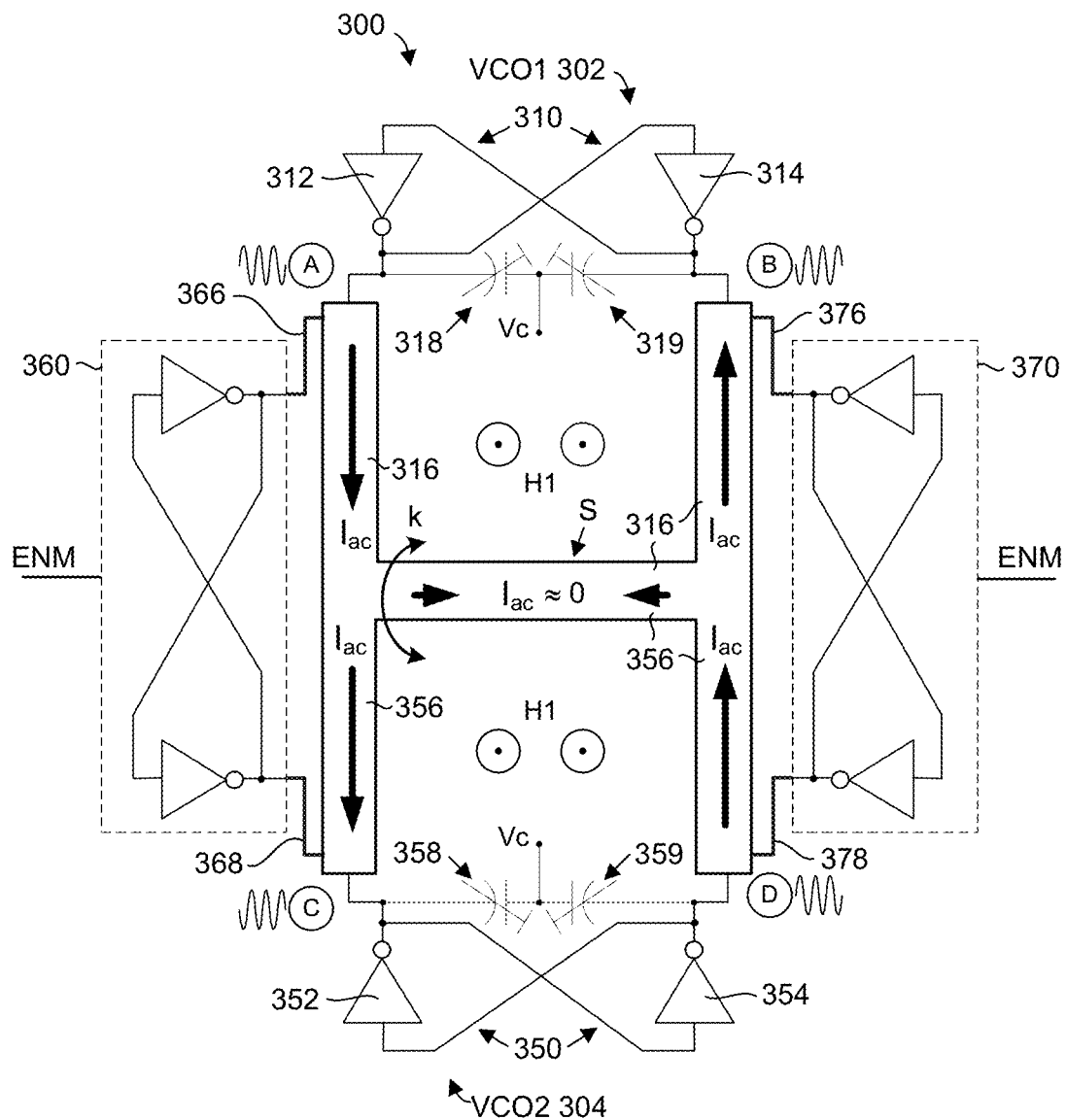
FIG. 3 is an example embodiment of a multimode oscillator according to the present disclosure configured to operate in one of multiple different modes of oscillation thereby increasing the frequency tuning range of the oscillator.

FIG. 3 is an example embodiment of a multimode oscillator 300 according to the present disclosure configured to operate in one of multiple different modes of oscillation thereby increasing the frequency tuning range of the oscillator. Similar to the oscillator of FIG. 2, multimode oscillator 300 has a first pair 310 of cross-coupled differential amplifiers 312, 314, which are cross-coupled across a first node A and a second node B of the LC tank of VCO1 302. When amplifier pair 310 is enabled (active), it forces opposite oscillation phases on first node A and second node B, as represented by the example waveforms shown at nodes A and B in the figure. A second pair 350 of cross-coupled differential amplifiers 352, 354 are cross-coupled across a first node C and a second node D of the LC tank of VCO2 304. Similarly, when amplifier pair 350 is enabled, it forces opposite oscillation phases on first node C and second node D. Further, the oscillation frequency of VCO1 302 and/or VCO2 350 may be fine-tuned by configuring or adjusting the capacitance C of their respective LC tanks. For instance, one or more of capacitors 318, 319 and 358, 359 may be adjusted. In an embodiment, VCO1 302 and/or VCO2 350 comprise a programmable capacitance C module for selectively configuring the capacitance C of their LC tanks. In an embodiment, the programmable capacitance C module comprises a variable voltage-dependent capacitor (varactor).

However, multimode oscillator 300 has two additional cross-coupled amplifier pairs 360 and 370 relative to oscillator 200 of FIG. 2. Amplifier pair 360 is positioned between nodes A and C of oscillator 300, and amplifier pair 370 is positioned between nodes B and D.

Amplifier pairs 360 and 370 may be matched in size and electrical characteristics with respect to each other, but not necessarily with respect to amplifier pairs 310 and 350. Further, the two respective inductors 316 and 356 in VCO1 302 and VCO2 304 are electrically connected at least at one point. Similar to FIG. 2, in this embodiment inductors 316 and 356 share a common side, which is labelled 'S' in the figure thereby providing an electrical connection between them. The electrical connection between inductors 316 and 356 provides electrical current paths for the added amplifier pairs 360 and 370. It is to be noted that in FIG. 2, the electrical connection between inductors 216 and 256 was not necessary for the functionality of oscillator 200.

Figure 4:
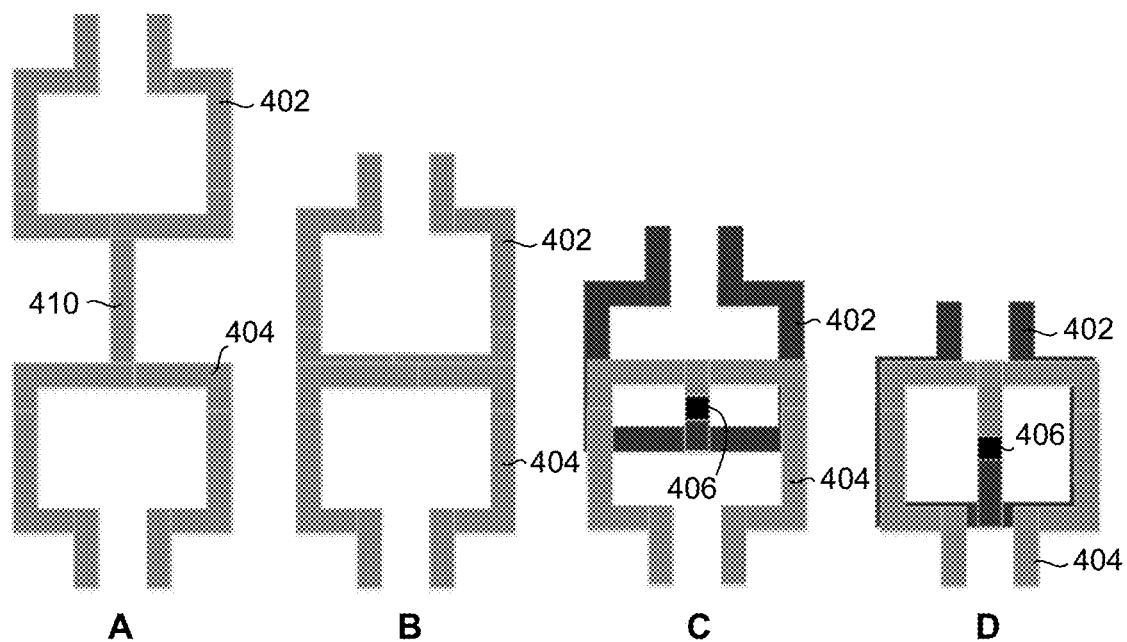
FIG. 4 shows different example positions of an inductor in a first core to an inductor in a second core in a multicore oscillator.

FIG. 4 shows some different example positions of an inductor 402 in a first core to an inductor 404 in a second core of a multicore oscillator, where in each case the two inductors are electrically connected at least at one point. As mentioned above, in the embodiment of FIG. 2, inductors 216 and 256 share a common side, which is labelled 'S' in the figure. Similarly, in FIG. 3, inductors 316 and 356 share a common side. The magnetic coupling factor between the two inductors lies between 0 and 1 (0<k<1) and is a function of center-to-center distance, the dimensions and the number of turns of the two inductors. Two inductors at smaller center-to-center distance exhibit larger k, and vice versa. Two extreme cases are as follows.

k=0 means no magnetic coupling (or complete isolation) between the two inductors. If the center-to-center distance of the two inductors is much larger than the dimensions of each inductor, k will approach zero.

k=1 means full coupling of magnetic flux from one inductor to the other. It implies a complete overlap or alignment of one inductor on top of the other with minimum dielectric thickness or gap between the overlapped metallic turns of the two inductors.

Again, in the embodiment of FIG. 2, inductors 216 and 256 share one side, meaning center-to-center distance is the same as one dimension of each inductor (for example height or width for a rectangular-shaped inductor). Therefore, the two inductors have very little/no overlap, hence k is expected to be relatively small but non-zero. Simulations showed that k for the example embodiment of FIG. 2 is around 0.2.

In other embodiments, the inductors of each LC tank need not share a common side. For example, the inductors may be spaced apart from each other, or may partially or full overlap with each other, as depicted in the examples in FIG. 4. A requirement in terms of inductor positioning is that an electrical connection is needed between the two inductors at or near the point of symmetry of the inductors to provide a path for the currents between amplifier pairs 360 and 370.

In FIG. 4, the distance between the two inductors 402, 404 decreases from left to right until a full overlap is achieved, as shown in example positioning D. In example positioning A, inductors 402, 404 are spaced apart and are electrically connected via a connector 410. In example positioning B, a side of inductors 402, 404 overlap. In example positioning C, inductors 402, 404 partially overlap. In example positioning D, inductors 402, 404 fully overlap. Different tones of grey indicate different metal layers stacked in 3rd dimension and connected by vias 406 in the integrated circuit process. Vias 406 connect two stacked metal layers at an overlap point. The relative inductor positioning of the embodiments of FIGS. 2 and 3 corresponds to example positioning B in FIG. 4.

The spacing between two inductors 402, 404 affects both the first and second oscillation frequencies, f1 and f2, since the spacing affects mutual coupling factor k, which in turn affects L1 and L0 according to equations [(1±k)·L0']. Thus, the inductor spacing affects the frequency separation (e.g. difference) of the first and second oscillation frequencies, and hence the overall frequency tuning range of the oscillator. Thus, the inductor spacing may be a design feature that is configured, meaning adjusted or set, to obtain an overall oscillator having a desired overall frequency tuning range.

Turning back to FIG. 3, amplifier pairs 360 and 370 each have a common enable control input ENM with two possible logic states ENM=0 and ENM=1. When ENM=1, a new dominant mode of oscillation is triggered, herein referred to as a first mode of oscillation (Mode 1). When ENM=0, amplifier pairs 360 and 370 are disabled (de-activated) and entire oscillator 300 of FIG. 3 effectively operates in an identical manner as oscillator 200 in FIG. 2 with both of amplifiers 202 and 204 enabled. This is referred to herein as a second mode of oscillation (Mode 2) and oscillator 300 operates at frequency of f2. Frequency f2 may thus be the same as frequency f0 in oscillator 200 of FIG. 2, assuming negligible frequency error (or shift) due to minor loading effect on the LC tanks by amplifier pairs 360 and 370 when in disabled state. When ENM=1, amplifier pairs 360 and 370 are enabled (activated). In this case, owing to its cross-coupled configuration, amplifier pair 360 forces opposite oscillation phases on nodes A and C, while for a similar reason cross-coupled amplifier pair 370 forces opposite oscillation phases on nodes B and D. At the same time, cross-coupled amplifier pair 310 forces opposite oscillation phases on nodes A and B, and cross-coupled amplifier pair 350 forces opposite oscillation phases on nodes C and D. In other words, nodes A and D have the same oscillation phase, and both nodes B and C have the opposite phase. Meanwhile, the frequency at all of nodes A, B, C, D is the same.

Overall, the configuration enabled by ENM=1 triggers the new dominant mode of oscillation, namely the first mode of oscillation (Mode 1), where the dual-core oscillator 300 operates at frequency f1, which is higher than frequency f2 of oscillator 300 in the second mode of oscillation (Mode 2). Oscillation currents $I_{ac}$ in two inductor loops 316 and 356 are forced to circulate in the same direction, both clockwise or counterclockwise, thereby causing a current cancellation in the common side 'S' of each inductor 316 and 356 indicated by the two smaller arrows pointing at one another. Also, the circulation of oscillation currents $I_{ac}$ in each inductor loop 316, 356 in the same direction causes the polarities of the magnetic fields H1 of each inductor loop 316, 356 to be oriented in the same direction. The polarity of the magnetic field H1 of each of cores VCO1 302 and VCO2 304 is directed out of the page according to the right-hand rule and indicated by the two circles each containing a dot (⊙) in the central region of each inductor loop. The magnetic field of each inductor loop is indicated with only two circles in FIG. 3, as opposed to three circles in FIG. 2, to represent the field generated by current in each of the three sides of each inductor loop. There are no circles corresponding to the common side 'S' of the two inductor loops 316, 356 since there is little to no oscillation current in this side. An alternative interpretation of this is that in oscillator 300 in FIG. 3, the 3D magnetic flux lines from the two inductor loops add destructively, leading to partial cancellation and a smaller total magnetic flux in each loop.

The current cancellation (or destructive magnetic field combination) in circuit 300 of FIG. 3, compared to circuit 200 of FIG. 2, makes the overall magnetic flux 1 of the two inductor loops 316 and 356 smaller (H1<H0) and manifests itself as a smaller overall inductance L1 exhibited by the two inductor loops. In other words, the opposite polarity of the magnetic coupling in this case (−k, instead of k) makes the overall inductance smaller (L1=[(1−k) L0'], L1<L0'<L0), which in turn leads to a higher oscillation frequency f1 for the dual-core oscillator 300 of FIG. 3, compared to that in FIG. 2, that is f1>f0. This mode of oscillation is known here as Mode 1. Again, oscillator 200 of FIG. 2 may be equivalent to oscillator 300 of FIG. 3 when configured in the second mode of oscillation (Mode 2) where amplifier pairs 360 and 370 are disabled and thus oscillator 300 operates at oscillation frequency f2. In such a case, f2=f0 and f1>f2. The specific frequency and phase relationships between the oscillation phases at nodes A, B, C, and D in this configuration define a further particular mode of oscillation for oscillator 300.

The first oscillation frequency f1 is at least partly determined by the spacing between inductor 316 of the LC resonance tank of first oscillator VCO1 302 and inductor 356 of the LC resonance tank of second oscillator VCO2 350, and partly by the configuration of the cross-coupled amplifier pairs 360 and 370.

In summary, the addition of the configurable amplifier pairs 360 and 370 in the dual-core oscillator 300 of FIG. 3 creates at least one additional mode of oscillation that exhibits a higher oscillation frequency f1 than the oscillation frequency f0 of the natural mode of oscillation of oscillator 200 in FIG. 2, known here as Mode 2.

Figure 5:
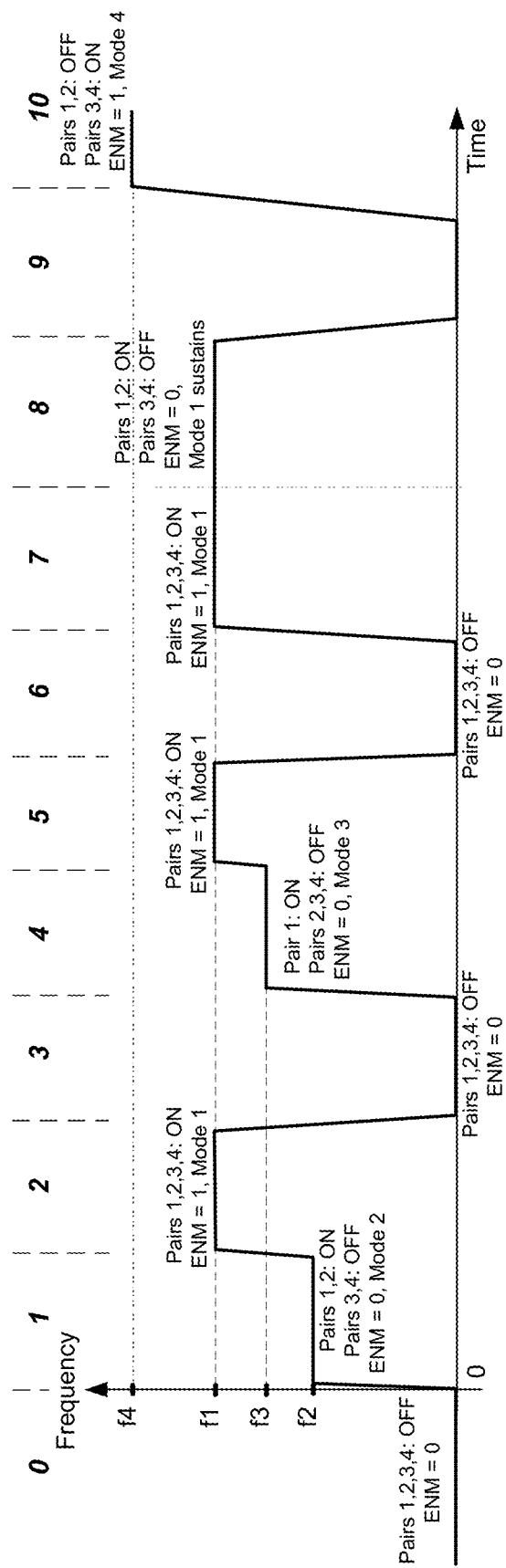
FIG. 5 is a graph illustrating the oscillation frequency of the oscillator of FIG. 3 as the oscillator is sequenced through different configurations or oscillation modes.

FIG. 5 is a graph illustrating the oscillation frequency of oscillator 300 of FIG. 3 as the oscillator is sequenced through different configurations, each triggering a different mode of oscillation (e.g. Mode 1, Mode 2, Mode 3, Mode 4) with respective oscillation frequencies f1, f2, f3, f4. Modes 3 and 4 are introduced and described further below. The graph is labeled with regions '0' through '10' going from left to right for ease of description. Again, frequency f2 of oscillator 300 of FIG. 3 is the same as frequency f0 of oscillator 200 of FIG. 2, assuming negligible impact on the LC tanks by amplifier pairs 360 and 370 in OFF state.

In region 0, all amplifier pairs 310, 350, 360, 370 are OFF and ENM=0. In region 1, amplifier pairs 310, 350 are ON, amplifier pairs 360, 370 are OFF, since ENM=0. The oscillator has a frequency of f2 and is operating in a second mode of oscillation (Mode 2). In region 2, amplifier pairs 310, 350 are ON, and amplifier pairs 360, 370 are also ON since ENM=1. The oscillator has a higher oscillation frequency f1 than f2 and is operating in a first mode of oscillation (Mode 1). In region 3, all amplifier pairs 310, 350, 360, 370 are OFF and ENM=0.

In region 4, amplifier pair 310 is ON, amplifier pairs 350, 360, 370 are OFF, and ENM=0. The oscillator has an oscillation frequency f3, which is higher than f2 but lower than f1, and is operating in a third mode of oscillation (Mode 3). This configuration where only one of amplifier pairs 310 and 350 is enabled is similar to the configuration of oscillator 200 discussed above in relation to FIG. 2, where only one of the differential amplifier pairs 210 or 250 is enabled and the effective inductance in the oscillator is a standalone self-inductance L0', and the oscillator operates at oscillation frequency f0'. Thus, f3=f0', assuming negligible impact on the LC tanks by amplifier pairs 360 and 370 in OFF state. In the configuration of region 4 of FIG. 5, there is no oscillation current from amplifier 350 circulating between nodes C and D, and thus there is no constructive or destructive magnetic field due the lower inductor loop (in FIG. 3). Therefore, the standalone inductance (self-inductance) L0' of the inductor loop 316 determines the frequency of the oscillation and the oscillatory current between nodes A and B. This specific frequency and phase relationships between the oscillation phases at nodes A, B, C, and D define a further particular mode of oscillation for oscillator 300, known here as Mode 3. In another configuration, rather than amplifier pair 310 being enabled, amplifier pair 350 is enabled and pair 310 is disabled. In either configuration, where only one of differential amplifier pairs 310, 350 is enabled, while the other of differential amplifier pairs 360, 370 are all disabled, the effective inductance in the oscillator core that is active (meaning the core that has its amplifier pair enabled) will be the standalone self-inductance L0' of one inductor 316 or 356, and hence the oscillation frequency will be $f_3=f_0'=1/(2\pi\sqrt{L_0' \cdot C})$. L1<L0'<L0, the oscillation frequency f3 (Mode 3) will be lower than f1, but higher than f2 (i.e., f2<f3<f1).

In region 5, amplifier pairs 310, 350 are ON, and amplifier pairs 360, 370 are also ON since ENM=1. Similar to region 2, oscillator 300 has oscillation frequency f1 and is operating in the first mode of oscillation (Mode 1), having transitioned from Mode 3 to Mode 1. In region 6, all amplifier pairs 310, 350, 360, 370 are OFF and ENM=0. In region 7, amplifier pairs 310, 350 are ON, and amplifier pairs 360, 370 are also ON since ENM=1. Similar to regions 2 and 5, oscillator 300 has oscillation frequency f1 and is operating in the first mode of oscillation (Mode 1), having transitioned from OFF state to Mode 1. In region 8, amplifier pairs 310, 350 are ON, amplifier pairs 360, 370 are OFF, since ENM=0. The oscillator has a frequency of f1 and is sustaining the first mode of oscillation (Mode 1) that it acquired in region 7.

FIG. 5 shows that the first mode of oscillation (Mode 1) may be triggered either by transitioning from the second mode of oscillation (Mode 2) in region 1, or from the third mode of oscillation (Mode 3) in region 5, or directly from a power-down (OFF) state in region 6. Moreover, FIG. 5 shows that once the oscillator is in the first mode of oscillation (Mode 1), this mode of oscillation dominates and sustains whether amplifier pairs 360, 370 are kept ON (as in regions 2, 5 and 7), or both are turned OFF (as in region 8). However, if amplifier pairs 360, 370 are kept ON, the oscillator consumes more power and generally achieves slightly lower (better) phase noise.

It is to be understood that the sequence of different configurations shown in FIG. 5 is merely an example and is not meant to be limiting.

Figure 6:
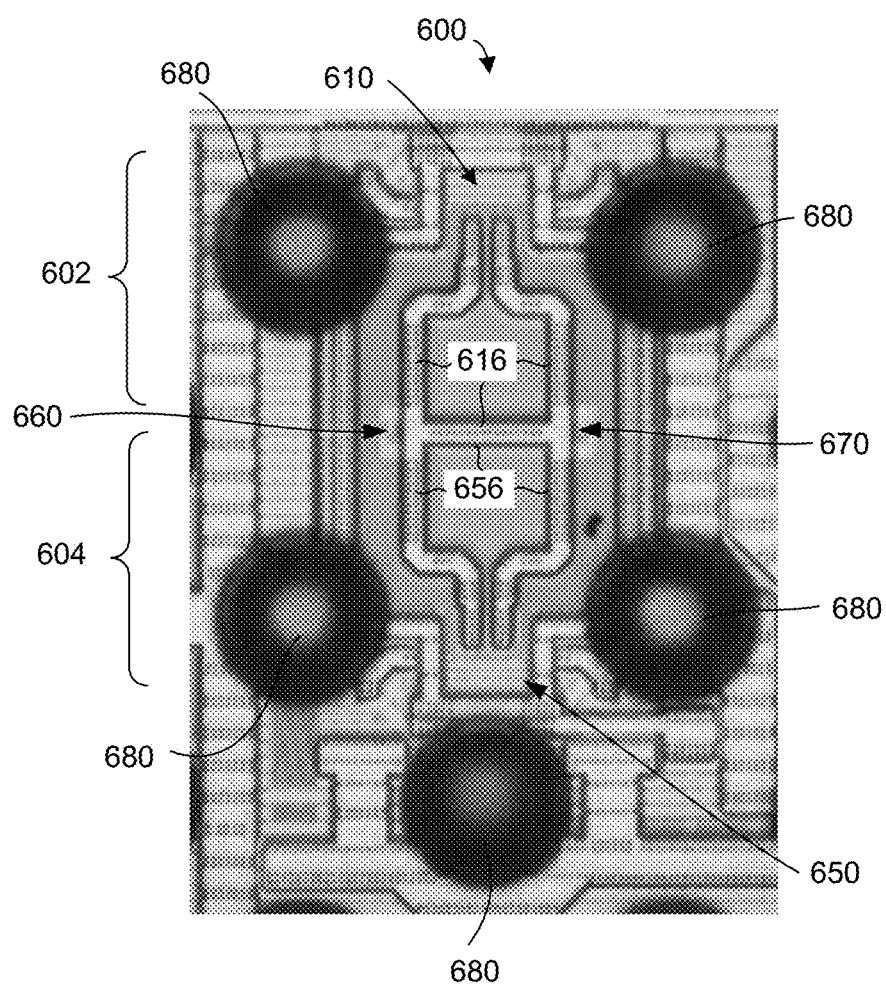
FIG. 6 is a photomicrograph of a test chip according to the present disclosure.

Example simulations and an implemented test chip demonstrated that the first mode of oscillation (Mode 1) oscillates robustly at about 12% to 30% faster than the second mode of oscillation (Mode 2), depending on the capacitor value setting in the LC tank. Since the oscillator frequency is known to be tunable through other means such as a control voltage adjusting varactors, or via switchable capacitors, the introduction of a new oscillation mode (e.g. first mode, Mode 1) at higher frequencies significantly extended the overall frequency tuning range of the oscillator in this design. A proof-of-concept 24-37 GHz VCO prototype was implemented utilizing a 16 nm FinFET CMOS process. FIG. 6 shows a photomicrograph of the implemented test chip 600 having two oscillator cores 602, 604, which may correspond to VCO1 302 and VCO2 304 in FIG. 3. Inductors 616, 656, and amplifier pairs 610, 650, 660, 670 are also labeled, which may correspond to inductors 316, 356 and amplifier pairs 310, 350, 360, 370. Solder bumps 680 may be provided for flip-chip packaging to deliver power supply voltage and ground. In addition, using switchable capacitors, the VCO frequency may be tuned from 24 GHz to 27.5 GHz in the second mode of oscillation and from 27 GHz to 35.5 GHz in the first mode of oscillation. As a result, the overall tuning range of this oscillator was approximately doubled using the teachings of the present disclosure.

Figure 7:
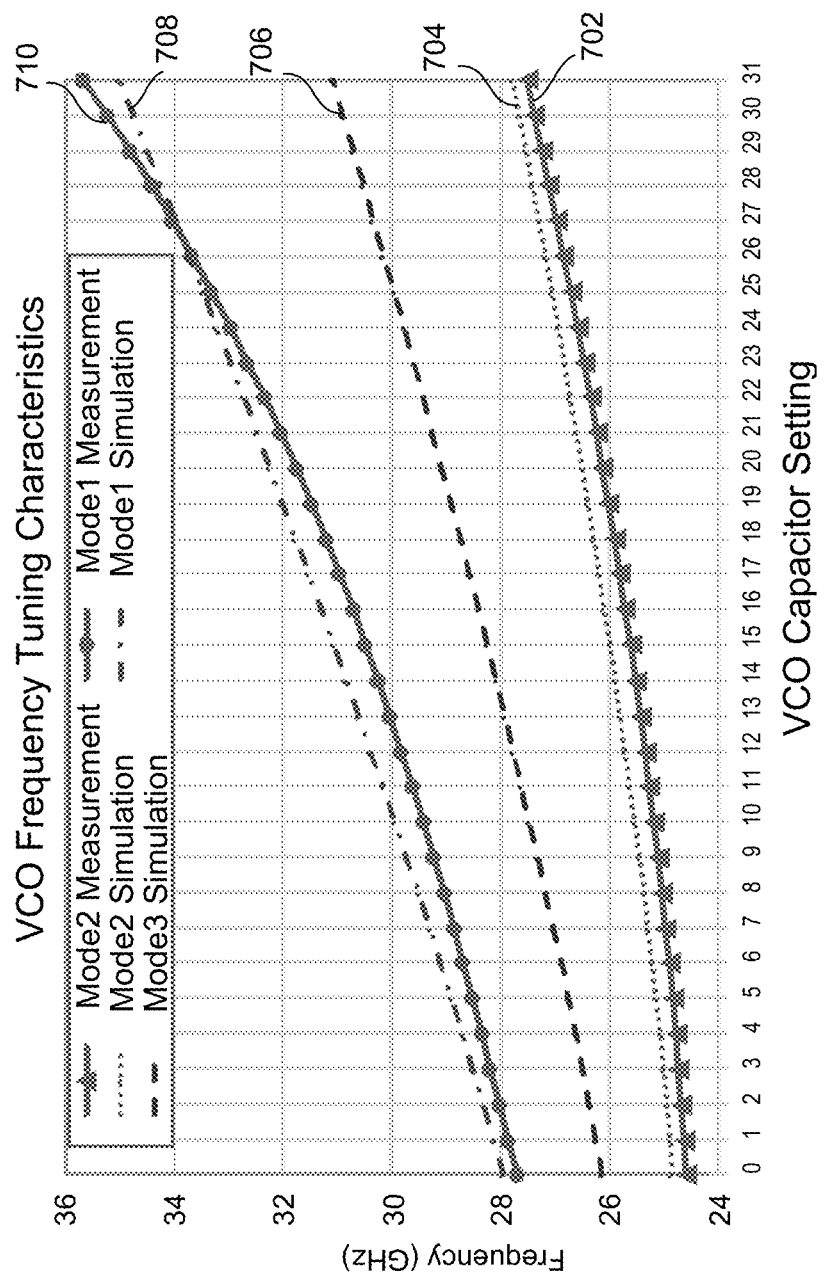
FIG. 7 is a graph showing oscillation frequency of a multimode oscillator in the three respective modes of oscillation versus LC tank capacitance.

FIG. 7 is a graph 700 showing example frequency tuning characteristics (y-axis) of oscillator 300 of FIG. 3, based on the above mentioned prototype implementation, in three respective modes of oscillation (Modes 1, 2, 3) versus switchable capacitor setting (x-axis). Both simulation and measurement data are shown. The VCO capacitor setting shown on the x-axis represents the number of switchable capacitor units disconnected from the capacitor bank of the LC VCO in this particular embodiment. A higher number of capacitors disconnected means a lower capacitance remaining in the LC tank, and thus a higher frequency of the oscillation ($f=1/(2\pi\sqrt{LC})$). Thus the oscillation frequency is shown increasing from left to right on the graph as the number of disconnected capacitors increases.

Line 702 represents measurement data in Mode 2. Line 710 represents measurement data in Mode 1. Line 704 represents simulation data in Mode 2. Line 706 represents simulation data in Mode 3. Line 708 represents simulation data in Mode 1.

According to the present disclosure, another different mode of oscillation may be achieved in at least some embodiments. In this mode, referred to as a fourth mode (Mode 4), an oscillation frequency f4 may be achieved where f4>f2.

Referring to FIG. 3, the fourth mode of oscillation is configured when amplifier pairs 360, 370 are ON (ENM=1), but amplifier pairs 310, 350 are OFF. In this embodiment, amplifier pairs 360, 370 on their own provide sufficient gain to sustain the oscillation robustly at frequency f4 of the fourth mode of oscillation, then nodes A and B exhibit identical oscillation frequencies and phases, while nodes C and D also exhibit identical oscillation frequencies and phases with respect to each other, but their phase is opposite (180° out-of-phase) with respect to the oscillation phase at nodes A and B. In this case, the inductance of one LC tank (on the left, in interaction with amplifier pair 360) is formed by the portions of inductors 316 and 356 located directly between nodes A and C, plus conductors 366, 368 connecting amplifier 360 to nodes A and C, respectively. The capacitance of this LC tank comprises the equivalent capacitance of any capacitors connected to the nodes A and C, including capacitors 318 and 358. The inductance of the other LC tank (on the right, in interaction with amplifier pair 370) is formed by the portions of inductors 316 and 356 located directly between nodes B and D, plus conductors 376, 378 connecting the amplifier 370 to nodes B and D, respectively. The capacitance of this LC tank comprises the equivalent capacitance of any capacitors connected to the nodes B and D, including capacitors 319 and 359.

In the design phase of the prototype test chip, this fourth mode of oscillation was observed at very high frequencies around approximately f4=60 GHz and exhibiting a relatively weak amplitude of oscillation. It is possible to suppress this mode of oscillation and make the first and second modes of oscillation more robust, using at least one of two design techniques described below.

In one technique, the transistors in amplifier pairs 360, 370 are sized down (e.g. MOS transistors implemented with smaller channel widths) to reduce their transconductance gain in order to make it too difficult for amplifier pairs 360, 370 to sustain steady-state oscillation at f4 while amplifier pairs 310, 350 are OFF.

In another technique to suppress this mode of oscillation, differential inductances seen by amplifier 360 (between nodes A and C) and seen by amplifier pair 370 (between nodes B and D) are reduced by locating or "tucking" the electrical connecting conductors 366, 368 and 376, 378, which connect amplifier pair 360 to nodes A and C and connect amplifier pair 370 to nodes B and D, respectively, under the metal layer(s) (i.e. conductors) of inductors 316, 356. In this manner, the areas of the two inductive loops formed by the portions of the inductors, as described above, and hence their respective inductances are reduced (inductance is proportional to the area of the loop formation) and thus the corresponding oscillation frequency (f4) is pushed to higher frequencies, where amplifier pairs 360, 370 due to their limited bandwidth do not provide sufficient gain to sustain this mode of oscillation.

Figure 8:
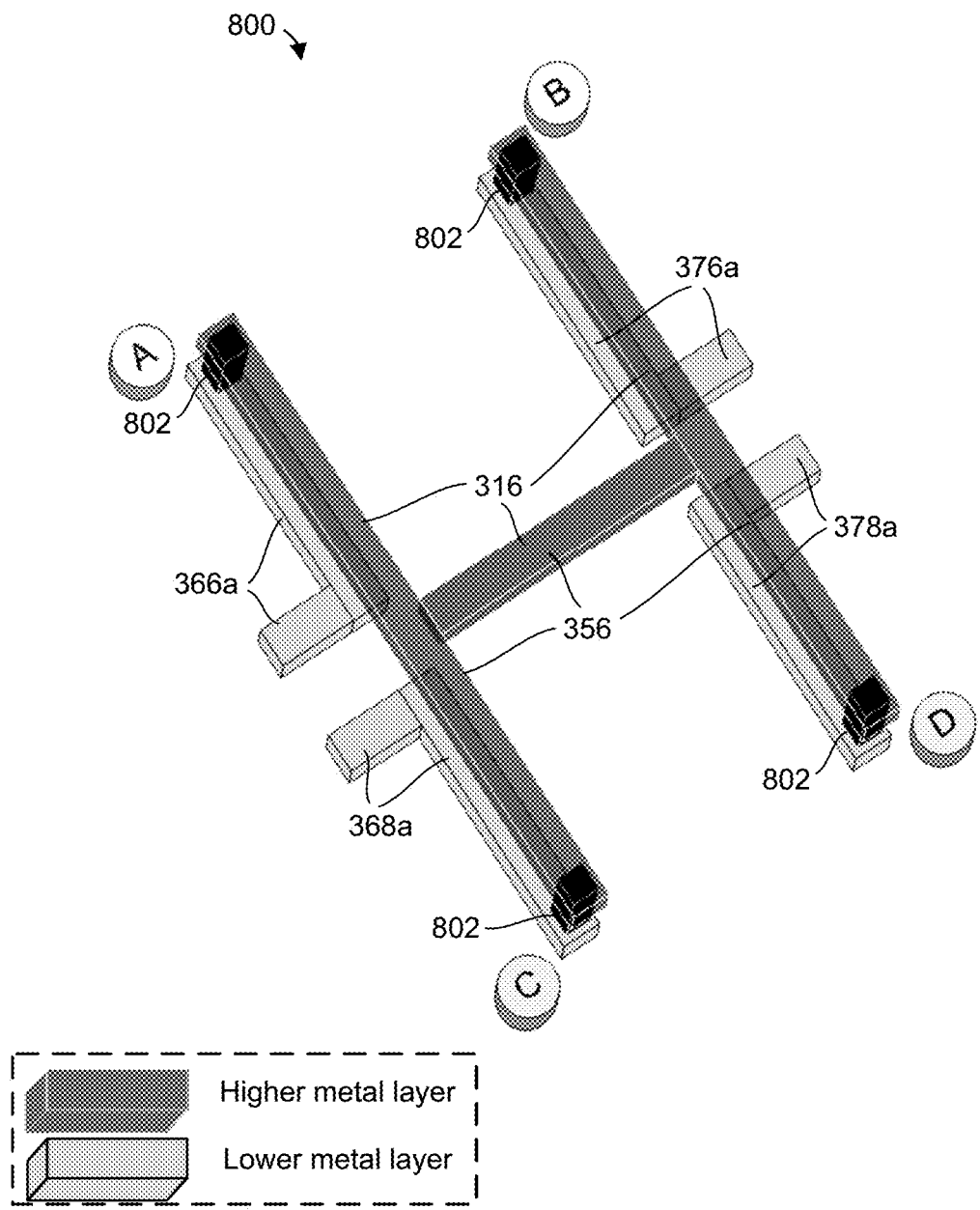
FIG. 8 is an example structure for connecting pairs of amplifiers to the inductors of a multimode multicore oscillator.

FIG. 8 is an example structure 800 illustrating this second technique. Connecting conductors 366, 368, 376, 378 shown in FIG. 3 are substituted for connecting conductors 366a, 368a, 376a, 378a as shown in FIG. 8, which are positioned "under" the conductors of inductors 316, 356. Inductors 316 and 356 therefore overlap connecting conductors 366a and 376a, and 368a, 378a, respectively, and are thus vertically aligned. Connecting conductors 366a, 376a, and 368a, 378a are electrically connected to inductors 316 and 356, respectively, by way of vias 802.

Figure 9:
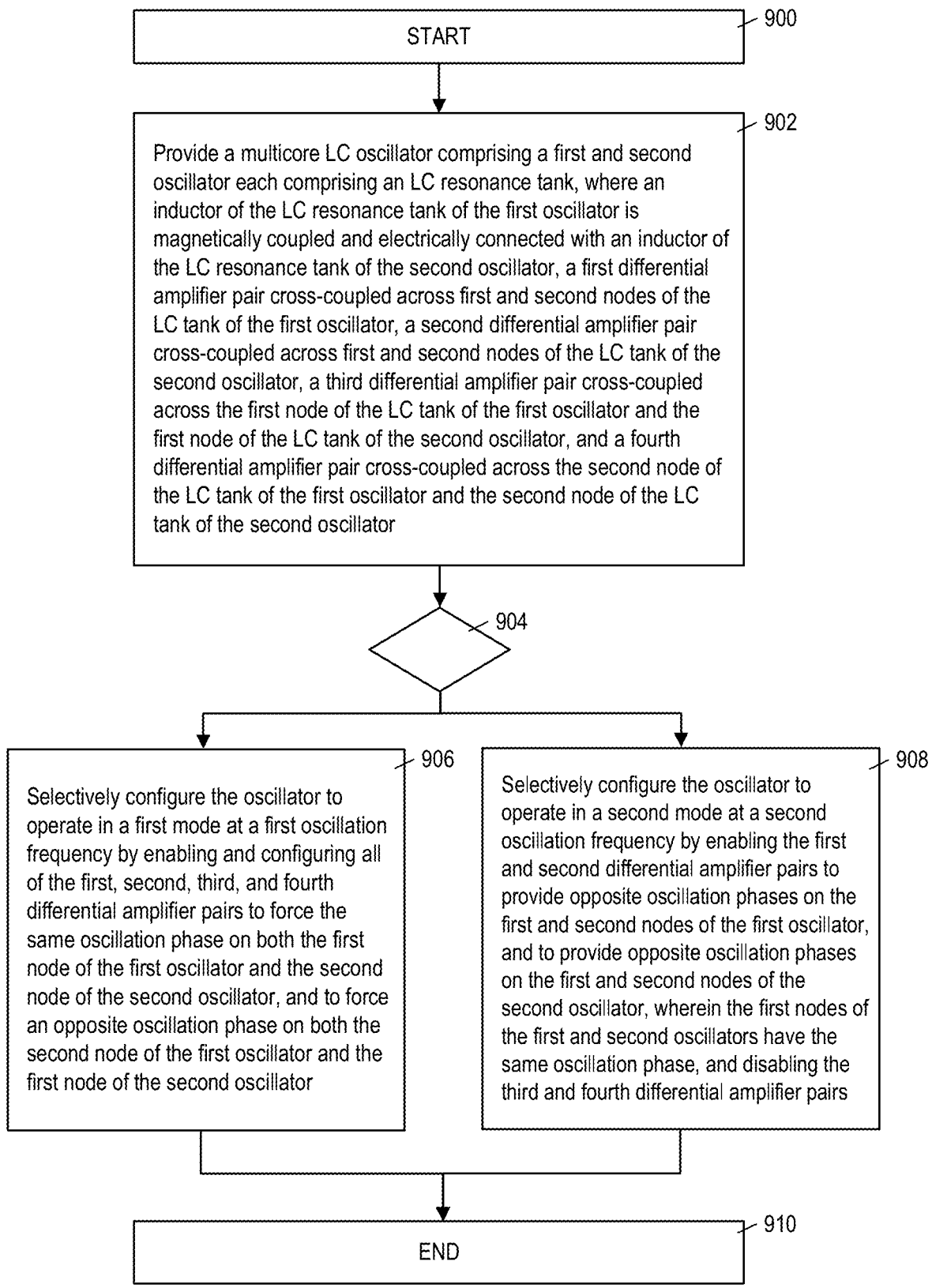
FIG. 9 is an example process of operating a multimode multicore LC oscillator in an embodiment according to the present disclosure.

FIG. 9 shows an example process of operating a multicore multimode LC oscillator in an embodiment according to the present disclosure.

The process starts at block 900 and proceeds to block 902, where the multicore LC oscillator is provided. In an embodiment, the oscillator comprises at least first and second oscillator each comprising an LC resonance tank, where an inductor of the LC resonance tank of the first oscillator is magnetically coupled and electrically connected with an inductor of the LC resonance tank of the second oscillator. The oscillator also comprises a first differential amplifier pair cross-coupled across first and second nodes of the LC tank of the first oscillator. The oscillator also comprises a second differential amplifier pair cross-coupled across first and second nodes of the LC tank of the second oscillator. The oscillator also comprises a third differential amplifier pair cross-coupled across the first node of the LC tank of the first oscillator and the first node of the LC tank of the second oscillator. The oscillator also comprises a fourth differential amplifier pair cross-coupled across the second node of the LC tank of the first oscillator and the second node of the LC tank of the second oscillator.

The process then proceeds to decision block 904 where it is determined whether the oscillator is to be operated in a first mode of oscillation or in a second mode of oscillation.

If the oscillator is to be operated in the first mode of oscillation, the process proceeds to block 906 where the oscillator is selectively configured to operate in the first mode at a first oscillation frequency. In particular, at block 906, all of the first, second, third, and fourth differential amplifier pairs are enabled and configured to force the same oscillation phase on both the first node of the first oscillator and the second node of the second oscillator, and to force an opposite oscillation phase on both the second node of the first oscillator and the first node of the second oscillator. In other words, with reference to FIG. 3, nodes A and D have the same oscillation phase, and both nodes B and C have the opposite phase. Meanwhile, the frequency at all of nodes A, B, C, D is the same. The configuration of the third and fourth differential amplifier pairs to force the opposite oscillation phases causes the oscillation currents in the inductors of each of the first and second oscillators to flow in the same clockwise or counterclockwise direction thereby causing the magnetic fields of the first and second oscillators to combine destructively.

At this stage, the oscillator is configured to oscillate within a frequency band fA, where frequency fA is tunable by varactors and switchable capacitors, from a lower limit of $fA_{min}$ to an upper limit of $fA_{max}$.

The process then proceeds to block 910 and ends. Alternatively, the process may proceed back to block 904, or to block 908.

Conversely, if it determined at block 904 that the oscillator is to be operated in the second mode of oscillation, the process proceeds to block 908 where the oscillator is selectively configured to operate in the second mode at a second oscillation frequency. The second mode is separate from the first mode, and the second oscillation frequency is lower than the first oscillation frequency. The first and second differential amplifier pairs are enabled to provide opposite oscillation phases on the first and second nodes of the first oscillator, and to provide opposite oscillation phases on the first and second nodes of the second oscillator, wherein the first nodes of the first and second oscillators have the same oscillation phase. The third and fourth differential amplifier pairs are disabled. The oscillator is configured to oscillate within a frequency band fB, where frequency fB is tunable by varactors and switchable capacitors from a lower limit of $fB_{min}$ to an upper limit of $fB_{max}$. Relative to block 906, $fB_{min} < fA_{min}$, and $fB_{max} < fA_{max}$.

The process then proceeds to block 910 and ends. Alternatively, the process may proceed back to block 904, or to block 906.

In an embodiment, although not shown, an oscillator may be communicatively connected to a controller for one or more of controlling, configuring, reconfiguring and operating the oscillator, including for implementing any of the aspects according to the present disclosure. The controller may comprise an electronic processor for executing instructions to control or configure the oscillator, and may also comprise an input/output interface for interfacing with other components or systems such as a computing device. The controller may further comprise a memory storing computer readable instructions for operation of the controller. In an embodiment, the controller may provide a control voltage to the multicore VCO for adjusting one or both of the oscillation frequency or oscillation phase of the multicore VCO, including but not limited to selectively configuring a variable capacitance of one or more cores of the oscillator. The controller may be used to enable and disable amplifier pairs of various cores of the oscillator.

Figure 10:
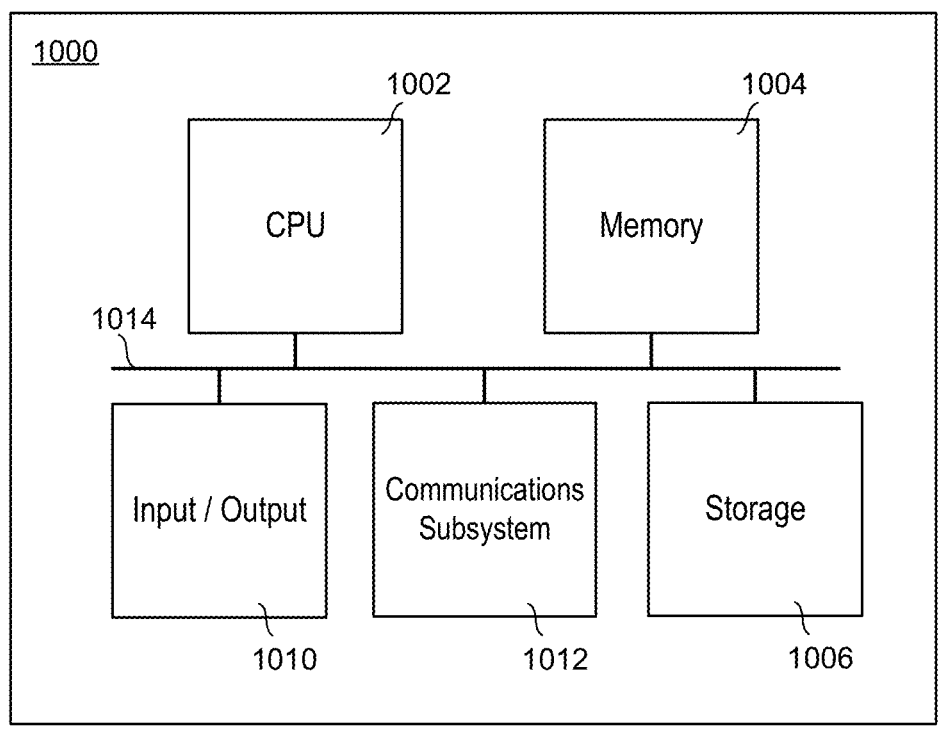
FIG. 10 is a block diagram of an example electronic device that may be used in implementing one or more aspects or components of an embodiment according to the present disclosure.

FIG. 10 is a block diagram of an example electronic device 1000 that may be used in implementing one or more aspects or components of an embodiment according to the present disclosure, including but not limited to a controller discussed above.

The electronic device 1000 may include one or more of a central processing unit (CPU) 1002, memory 1004, a mass storage device 1006, an input/output (I/O) interface 1010, and a communications subsystem 1012. One or more of the components or subsystems of electronic device 1000 may be interconnected by way of one or more buses 1014 or in any other suitable manner.

The bus 1014 may be one or more of any type of several bus architectures including a memory bus, storage bus, memory controller bus, peripheral bus, or the like. The CPU 1002 may comprise any type of electronic data processor, including without limitation an FPGA, a microprocessor and a microcontroller. A state machine may be substituted for CPU 1002 without exceeding the scope. The memory 1004 may comprise any type of system memory such as dynamic random-access memory (DRAM), static random-access memory (SRAM), synchronous DRAM (SDRAM), read-only memory (ROM), a combination thereof, or the like. In an embodiment, the memory may include ROM for use at boot-up, and DRAM for program and data storage for use while executing programs.

The mass storage device 1006 may comprise any type of storage device configured to store data, programs, and other information and to make the data, programs, and other information accessible via the bus 1014. The mass storage device 1006 may comprise one or more of a solid-state drive (SSD), hard disk drive (HDD), a magnetic disk drive, an optical disk drive, or the like. In some embodiments, data, programs, or other information may be stored remotely, for example in the "cloud". Electronic device 1000 may send or receive information to the remote storage in any suitable way, including via communications subsystem 1012 over a network or other data communication medium.

The I/O interface 1010 may provide interfaces to couple one or more other devices (not shown) to the electronic device 1000. The other devices may include but are not limited to one or more of a multicore VCO, and/or individual VCO cores of a multicore VCO. Furthermore, additional or fewer interfaces may be utilized. For example, one or more serial interfaces such as Universal Serial Bus (USB) (not shown) may be provided.

A communications subsystem 1012 may be provided for one or both of transmitting and receiving signals. Communications subsystem 1012 may include any component or collection of components for enabling communications over one or more wired and wireless interfaces. These interfaces may include but are not limited to USB, Ethernet (e.g. IEEE 802.3), high-definition multimedia interface (HDMI), Firewire (e.g. IEEE 1394), Thunderbolt™, WiFi™ (e.g. IEEE 802.11), WiMAX (e.g. IEEE 802.16), Bluetooth™, or Near-field communications (NFC), as well as GPRS, UMTS, LTE, LTE-A, and dedicated short range communication (DSRC). Communication subsystem 1012 may include one or more ports or other components for one or more wired connections (not shown). Additionally or alternatively, communication subsystem 1012 may include one or more transmitters, receivers, and/or antenna elements (not shown).

The electronic device 1000 of FIG. 10 is merely an example and is not meant to be limiting. Various embodiments may utilize some or all of the components shown or described. Some embodiments may use other components not shown or described but known to persons skilled in the art.

An oscillator according to the present disclosure may be used in any suitable application. For example, such an oscillator may be used as a voltage controlled oscillator (VCO) or current controlled oscillator (CCO or ICO) as part of any phase-locked loop (PLL) circuitry. A useful PLL example is a clock synthesizer unit (CSU) that is widely used in some serializer/de-serializer (SERDES) components to generate the required baud-rate clock for data transmitter (TX) or receiver (RX). Similar CSU designs may be used as a local oscillator (LO) in RF wireless mobile or base station applications. Analog clock-and-data recovery (CDR) PLL is another example on the RX side of a SERDES that may benefit from oscillators according to the present disclosure.

The present disclosure applies generally to multicore LC oscillators. Although aspects and embodiments according to the present disclosure are described with reference to voltage controlled oscillators, this is not intended to be limiting. The teachings of the present disclosure apply to oscillators other than voltage controlled oscillators.

Further, embodiments of the present disclosure are generally described and shown as being implemented with MOS transistors. It is to be appreciated however that the teachings of the present disclosure may be realized using other technologies, including but not limited to bipolar transistors, SiGe transistors, and GaAs transistors.

As used herein, the terms "connected", "connection", and "coupled" generally mean that the referred two elements interact electrically, whether directly or indirectly, such that an electrical current may flow from one to the other, unless indicated otherwise. The connection may include a direct conductive connection, a magnetic connection, a capacitive connection, a resistive connection, and/or any other suitable combination thereof to make electrical connection. Intervening components may be present.

In the preceding description, for purposes of explanation, numerous details are set forth in order to provide a thorough understanding of the embodiments. However, it will be apparent to one skilled in the art that these specific details are not required. In other instances, well-known electrical structures and circuits are shown in block diagram form in order not to obscure the understanding. For example, specific details are not provided as to whether the embodiments described herein are implemented as a software routine, hardware circuit, firmware, or a combination thereof.

Embodiments of the disclosure can be represented as a computer program product stored in a machine-readable medium (also referred to as a computer-readable medium, a processor-readable medium, or a computer usable medium having a computer-readable program code embodied therein). The machine-readable medium can be any suitable tangible, non-transitory medium, including magnetic, optical, or electrical storage medium including a diskette, compact disk read only memory (CD-ROM), memory device (volatile or non-volatile), or similar storage mechanism. The machine-readable medium can contain various sets of instructions, code sequences, configuration information, or other data, which, when executed, cause a processor to perform steps in a method according to an embodiment of the disclosure. Those of ordinary skill in the art will appreciate that other instructions and operations necessary to implement the described implementations can also be stored on the machine-readable medium. The instructions stored on the machine-readable medium can be executed by a processor or other suitable processing device, and can interface with circuitry to perform the described tasks.

The structure, features, accessories, and alternatives of specific embodiments described herein and shown in the Figures are intended to apply generally to all of the teachings of the present disclosure, including to all of the embodiments described and illustrated herein, insofar as they are compatible. In other words, the structure, features, accessories, and alternatives of a specific embodiment are not intended to be limited to only that specific embodiment unless so indicated.

In addition, the steps and the ordering of the steps of methods described herein are not meant to be limiting. Methods comprising different steps, different number of steps, and/or different ordering of steps are also contemplated.

For simplicity and clarity of illustration, reference numerals may have been repeated among the figures to indicate corresponding or analogous elements. Numerous details have been set forth to provide an understanding of the embodiments described herein. The embodiments may be practiced without these details. In other instances, well-known methods, procedures, and components have not been described in detail to avoid obscuring the embodiments described.

The above-described embodiments are intended to be examples only. Alterations, modifications and variations can be effected to the particular embodiments by those of skill in the art without departing from the scope, which is defined solely by the claims appended hereto.

The invention claimed is:

1. A multicore inductor-capacitor (LC) oscillator comprising:
   a first and a second oscillator each comprising an LC resonance tank, where an inductor of the LC resonance tank of the first oscillator is magnetically coupled and electrically connected with an inductor of the LC resonance tank of the second oscillator;
   a first differential amplifier pair cross-coupled across a first and a second node of the LC tank of the first oscillator;
   a second differential amplifier pair cross-coupled across a first and a second node of the LC tank of the second oscillator;
   a third differential amplifier pair cross-coupled across the first node of the LC tank of the first oscillator and the first node of the LC tank of the second oscillator; and
   a fourth differential amplifier pair cross-coupled across the second node of the LC tank of the first oscillator and the second node of the LC tank of the second oscillator,
   wherein the oscillator is configurable to operate in a first mode at a first oscillation frequency wherein:
      all of the first, second, third, and fourth differential amplifier pairs are enabled and configured to force the same oscillation phase on both the first node of the first oscillator and the second node of the second oscillator, and to force an opposite oscillation phase on both the second node of the first oscillator and the first node of the second oscillator, and
   wherein the oscillator is configurable to operate in a second mode, separate from the first mode, at a second oscillation frequency lower than the first oscillation frequency, wherein:
      the first and second differential amplifier pairs are enabled to provide opposite oscillation phases on the first and second nodes of the first oscillator, and to provide opposite oscillation phases on the first and second nodes of the second oscillator, wherein the first nodes of the first and second oscillators have the same oscillation phase; and
      the third and fourth differential amplifier pairs are disabled.

2. The multicore LC oscillator according to claim 1, configured to sustain substantially the first oscillation frequency after the third and fourth differential amplifier pairs are disabled while the first and second differential amplifier pairs remain enabled.

3. The multicore LC oscillator according to claim 1, wherein the third and fourth differential amplifier pairs are configured to have insufficient gain to sustain oscillation at an oscillation frequency that is higher than the first oscillation frequency.

4. The multicore LC oscillator according to claim 1, wherein at least a portion of a connecting conductor electrically connecting one of the third and fourth differential amplifier pairs to one of the first and second nodes of the LC tank of one of the first and second oscillators is substantially vertically aligned with at least a portion of a conductor of the inductor of the LC resonance tank of one of the first or second oscillators relative to a substrate on which the multicore LC oscillator is formed, thereby reducing the inductance introduced by the connecting conductor.

5. The multicore LC oscillator according to claim 1, wherein the LC resonance tank of at least one of the first and second oscillators comprises a programmable capacitance C module for selectively configuring the capacitance C of the LC tank to enable selective tuning of the oscillation frequency of the multicore LC oscillator.

6. The multicore LC oscillator according to claim 5, wherein the programmable capacitance C module comprises a variable voltage-dependent capacitor.

7. The multicore LC oscillator according to claim 1, wherein the spacing between the inductor of the LC resonance tank of the first oscillator and the inductor of the LC resonance tank of the second oscillator affects the frequency separation between the first and second oscillation frequencies.

8. The multicore LC oscillator according to claim 1, wherein the oscillator is configurable to operate in a third mode, separate from the first and second modes, at a third oscillation frequency higher than the second oscillation frequency and lower than the first oscillation frequency, wherein:
   only one of the first and second differential amplifier pairs is enabled, and
   the third and fourth amplifier pairs are disabled.

9. The multicore LC oscillator according to claim 1, wherein the oscillator is configurable to operate in a fourth mode, separate from the first and second modes, at a fourth oscillation frequency higher than the first oscillation frequency, wherein:
   the first and second differential amplifier pairs are disabled,
   the third and fourth differential amplifier pairs are enabled and configured to force the same oscillation phase on both the first and second nodes of the first oscillator, and to force an opposite oscillation phase on both the first and second nodes of the second oscillator,
   wherein the third and fourth amplifier pairs are configured to have sufficient gain to sustain oscillation at the fourth oscillation frequency corresponding to resonance frequency of any inductance and capacitance between the respective outputs of each of the third and fourth amplifier pairs.

10. A method of operating a multicore inductor-capacitor (LC) oscillator, the method comprising:
    providing the multicore LC oscillator, which comprises:
       a first and second oscillator each comprising an LC resonance tank, where an inductor of the LC resonance tank of the first oscillator is magnetically coupled and electrically connected with an inductor of the LC resonance tank of the second oscillator;
       a first differential amplifier pair cross-coupled across first and second nodes of the LC tank of the first oscillator;
       a second differential amplifier pair cross-coupled across first and second nodes of the LC tank of the second oscillator;
       a third differential amplifier pair cross-coupled across the first node of the LC tank of the first oscillator and the first node of the LC tank of the second oscillator; and a fourth differential amplifier pair cross-coupled across the second node of the LC tank of the first oscillator and the second node of the LC tank of the second oscillator, wherein the oscillator is selectively configurable to operate in a first mode at a first oscillation frequency by:
enabling and configuring all of the first, second, third, and fourth differential amplifier pairs to force the same oscillation phase on both the first node of the first oscillator and the second node of the second oscillator, and to force an opposite oscillation phase on both the second node of the first oscillator and the first node of the second oscillator, and wherein the oscillator is selectively configurable to operate in a second mode, separate from the first mode, at a second oscillation frequency lower than the first oscillation frequency,
enabling the first and second differential amplifier pairs to provide opposite oscillation phases on the first and second nodes of the first oscillator, and to provide opposite oscillation phases on the first and second nodes of the second oscillator, wherein the first nodes of the first and second oscillators have the same oscillation phase; and
disabling the third and fourth differential amplifier pairs, and
selectively configuring the oscillator to operate in one of the first mode and the second mode.

11. The method of claim 10, further comprising configuring the oscillator to sustain substantially the first oscillation frequency after the third and fourth differential amplifier pairs are disabled while the first and second differential amplifier pairs remain enabled.

12. The method of claim 10, further comprising configuring the third and fourth differential amplifier pairs to have insufficient gain to sustain oscillation at an oscillation frequency that is higher than the first oscillation frequency.

13. The method of claim 10, further comprising configuring the oscillator such that at least a portion of a connecting conductor electrically connecting one of the third and fourth differential amplifier pairs to one of the first and second nodes of the LC tank of one of the first and second oscillators is substantially vertically aligned with at least a portion of a conductor of the inductor of the LC resonance tank of one of the first or second oscillators relative to a substrate on which the multicore LC oscillator is formed thereby reducing the inductance introduced by the connecting conductor.

14. The method of claim 10, further comprising selectively tuning the oscillation frequency of the multicore LC oscillator by configuring a programmable capacitance C module of the LC resonance tank of at least one of the first and second oscillators to adjust the capacitance C of the LC tank.

15. The method of claim 14, wherein the configuring a programmable capacitance C module comprises adjusting a variable voltage-dependent capacitor.

16. The method of claim 10, wherein the spacing between the inductor of the LC resonance tank of the first oscillator and the inductor of the LC resonance tank of the second oscillator affects the frequency separation between the first and second oscillation frequencies.

17. The method of claim 10, wherein the oscillator is selectively configurable to operate in a third mode separate from the first and second modes, and at a third oscillation frequency higher than the second oscillation frequency and lower than the first oscillation frequency by:
enabling only one of the first and second differential amplifier pairs, and
disabling the third and fourth amplifier pairs,
wherein the method further comprises selectively configuring the oscillator to operate in one of the first mode, the second mode, and the third mode.

18. The method of claim 10, wherein the oscillator is selectively configurable to operate in a fourth mode, separate from the first and second modes, at a fourth oscillation frequency higher than the first oscillation frequency by:
disabling the first and second differential amplifier pairs;
enabling and configuring the third and fourth differential amplifier pairs to force the same oscillation phase on both the first and second nodes of the first oscillator, and to force an opposite oscillation phase on both the first and second nodes of the second oscillator, and to have sufficient gain to sustain oscillation at the fourth oscillation frequency corresponding to resonance frequency of any inductance and capacitance between the respective outputs of each of the third and fourth amplifier pairs,
wherein the method further comprises selectively configuring the oscillator to operate in one of the first mode, the second mode, and the fourth mode.

19. A multicore inductor-capacitor (LC) oscillator comprising:
a first and a second oscillator each comprising an LC resonance tank, where an inductor of the LC resonance tank of the first oscillator is magnetically coupled and electrically connected with an inductor of the LC resonance tank of the second oscillator;
a first differential amplifier pair cross-coupled across a first and a second node of the LC tank of the first oscillator;
a second differential amplifier pair cross-coupled across a first and a second node of the LC tank of the second oscillator;
a third differential amplifier pair cross-coupled across the first node of the LC tank of the first oscillator and the first node of the LC tank of the second oscillator; and
a fourth differential amplifier pair cross-coupled across the second node of the LC tank of the first oscillator and the second node of the LC tank of the second oscillator,
wherein the oscillator is configurable to operate in a first mode at a first oscillation frequency wherein:
all of the first, second, third, and fourth differential amplifier pairs are enabled and configured to force the same oscillation phase on both the first node of the first oscillator and the second node of the second oscillator, and to force an opposite oscillation phase on both the second node of the first oscillator and the first node of the second oscillator, and
wherein the oscillator is configured to sustain substantially the first oscillation frequency after the third and fourth differential amplifier pairs are disabled while the first and second differential amplifier pairs remain enabled.

* * * * *

UNITED STATES PATENT AND TRADEMARK OFFICE
CERTIFICATE OF CORRECTION

PATENT NO. : 10,749,470 B2
APPLICATION NO. : 16/185644
DATED : August 18, 2020
INVENTOR(S) : Djahanshahi et al.

Page 1 of 1

It is certified that error appears in the above-identified patent and that said Letters Patent is hereby corrected as shown below:

In the Claims

Column 19, Claim 10, Line 17:
Replace "quency," with -quency, by:-.

Signed and Sealed this
Third Day of November, 2020

Andrei Iancu
*Director of the United States Patent and Trademark Office*